United States Patent
Huang et al.

(10) Patent No.: US 8,462,554 B2
(45) Date of Patent: Jun. 11, 2013

(54) OVER-ERASE VERIFICATION AND REPAIR METHODS FOR FLASH MEMORY

(75) Inventors: Chung-Meng Huang, Hsinchu County (TW); Im-Cheol Ha, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 224 days.

(21) Appl. No.: 13/039,692

(22) Filed: Mar. 3, 2011

(65) Prior Publication Data

US 2012/0224432 A1    Sep. 6, 2012

(51) Int. Cl.
*G11C 16/06* (2006.01)
*G11C 16/28* (2006.01)

(52) U.S. Cl.
CPC .................................. *G11C 16/28* (2013.01)
USPC .............. 365/185.22; 365/185.2; 365/201; 365/185.03; 365/185.28

(58) Field of Classification Search
USPC ................. 365/185.2, 185.22, 201, 185.03, 365/185.28
See application file for complete search history.

(56) References Cited

U.S. PATENT DOCUMENTS 6,515,910 B1 *    2/2003    Lee et al. ................. 365/185.22

* cited by examiner

*Primary Examiner* — Thong Q Le
(74) *Attorney, Agent, or Firm* — Muncy, Geissler, Olds & Lowe, PLLC

(57) ABSTRACT

Over-erase verification and repair methods for a flash memory. The flash memory is an NOR type stack flash. The disclosed method performs an over-erased column verification test on a sector of the NOR type stack flash column by column. An over-erased column repair process is individually performed on the columns which do not pass the over-erased column verification test. For the columns processed by the over-erased column repair process but still incapable of passing the over-erased column verification test, an over-erased bit verification test is performed on each bit thereof. The bits incapable of passing the over-erased bit verification test are further processed by an over-erased repair process individually.

7 Claims, 5 Drawing Sheets

OVER-ERASE VERIFICATION AND REPAIR METHODS FOR FLASH MEMORY

BACKGROUND OF THE INVENTION

1. Field of the Invention

The present invention relates to an NOR type stack flash and over-erase verification and repair methods thereof.

2. Description of the Related Art

An NOR type stack flash requires an erase operation, to erase all storage cells to an identical value. However, some of the storage cells may be over-erased during the erase operation. The threshold voltage for the transistors (such as MOSs) of the over-erased storage cells is quite low, which results in current leakage.

To solve the current leakage problem, it is important to properly improve the over-erased storage cells.

BRIEF SUMMARY OF THE INVENTION

NOR type stack flashes and over-erase verification and repair methods thereof are introduced. The disclosed method performs an over-erased column verification test on one sector of the NOR type stack flash column by column, and performs an over-erased column repair process on those columns which do not pass the over-erased column verification test. For the columns which were already processed by the over-erased column repair process but still do not pass the over-erased column verification test, an over-erased bit verification test is performed on each bit thereof. For the bits which do not pass the over-erased bit verification test, an over-erased bit repair process is performed thereon individually.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
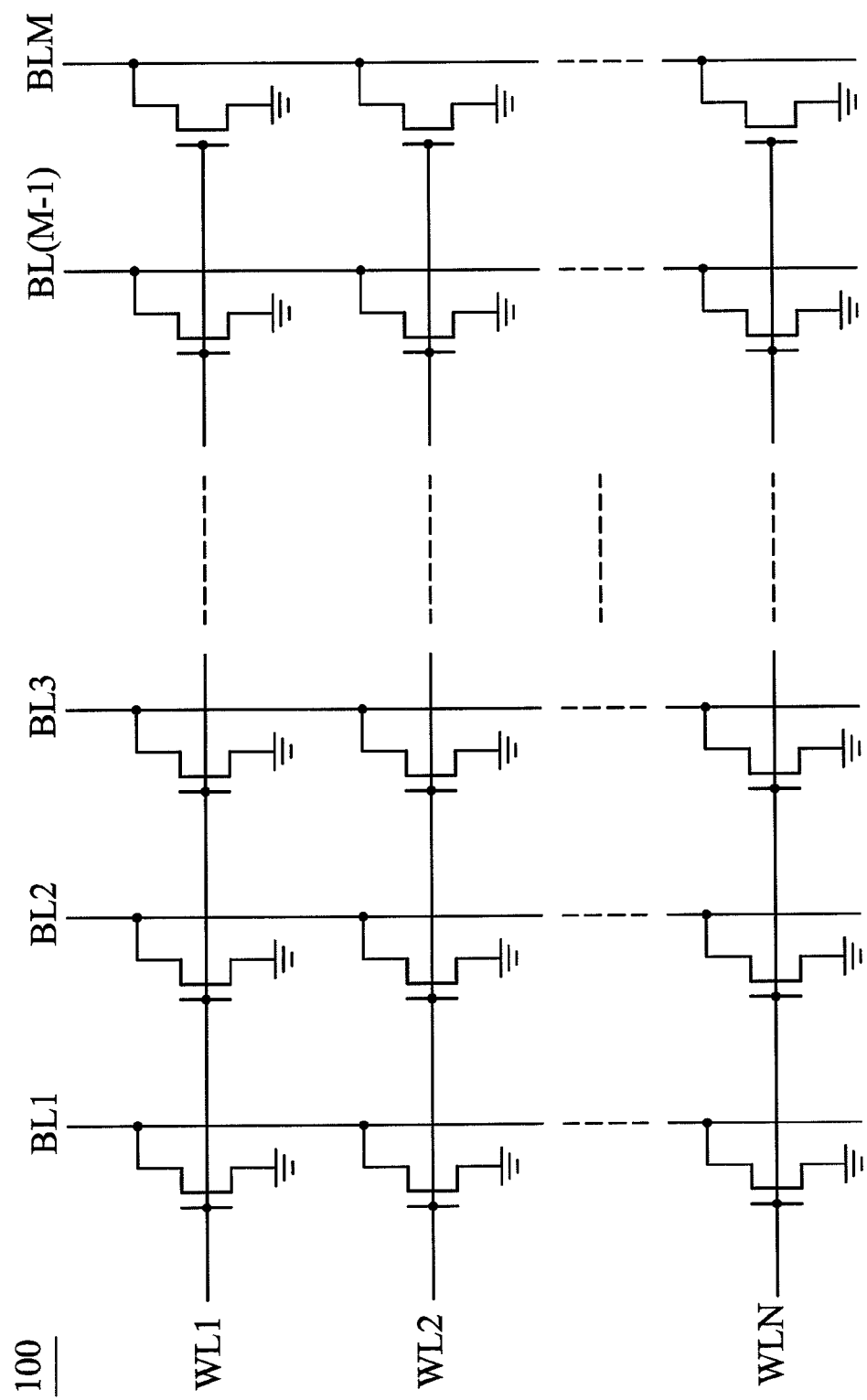
FIG. 1 depicts an exemplary embodiment of an array of storage cells of an NOR type stack flash.

FIG. 1 depicts an exemplary embodiment of a storage cell array, which corresponds to one sector of an NOR type stack flash and is labeled '100'. Some of the storage cells may be over-erased by an erase operation. For example, when erasing the first column of storage cells (including the storage cells connected to a bit line BL1), the control system may find that it is hard to erase some storage cells of the first column. The erase operation may be repeated on the whole column again and again until all storage cells of the first column are confirmed to be erased. Although the repeating erase operation can completely erase some storage cells which cannot erase easily, the other storage cells of the first column may be over-erased. The over-erased storage cells may have transistors with low threshold voltages To cope with the problems of the over-erased storage cells, solutions are disclosed herein, which involve an over-erased column verification test, an over-erased column repair process, an over-erased bit verification test and an over-erased bit repair process. These techniques are discussed in detail in the following.

As for the over-erased column verification test, it verifies a whole column of storage cells within one single procedure. The result of the over-erased column verification test shows whether the verified column includes any over-erased storage cell. Note that the over-erased column verification test may not explicitly point out the over-erased storage cells of the verified column. The over-erased column verification test may be realized by any well-known over-erase verification technique which uses each column of storage cells as a unit for verification.

As for the over-erased column repair process, it is performed on a whole column of storage cells but not on the storage cells individually. The column repair may be realized by any well-known repair technique which uses each column as a unit for repair.

As for the over-erased bit verification test, it is performed on each single storage cell (one bit) or is performed on several storage cells (one byte). The result of the over-erased bit verification test shows whether the verified bit/byte is/are over-erased. The over-erased bit verification test may be realized by any well-known verification technique which uses each bit/byte as a unit for verification. For simplicity, in the specification, the verification tests performed on each single bit or on each single byte are all named over-erased bit verification test. Note that the disclosed techniques performed on each single bit can be performed on each single byte as well.

As for the over-erased bit repair process, it is performed on each single storage cell (one bit) or is performed on several storage cells (one byte). The over-erased bit repair process may be realized by any well-known repair technique which uses each bit/byte as a unit for verification to repair. For simplicity, in the specification, the repair processes performed on each single bit or on each single byte are all named over-erased bit repair process. Note that the disclosed techniques performed on each single bit can be performed on each single byte as well.

Furthermore, the over-erased column repair process and the over-erased bit repair process are provided to raise the threshold voltage of the transistor(s) (such as MOS(s)) of the repaired storage cell(s), and thereby the current leakage of the transistor(s) can be reduced. The techniques for raising the threshold voltage are named soft program or post program techniques, wherein those performed on a whole column of storage cells are named column-by-column soft program techniques and can be implemented as the aforementioned over-erased column repair process, and those performed on each single bit are named bit-by-bit soft program techniques and can be implemented as the aforementioned over-erased bit repair process.

According to an exemplary embodiment of the invention, an over-erase verification and repair method for an NOR type stack flash are discussed in this paragraph. This method performs an over-erased column verification test on a sector (corresponding to the array 100 of storage cells) of an NOR type stack flash to verify the sector column by column and, for the columns which do not pass the over-erased column verification test, an over-erased column repair process is performed thereon. For those columns which were already processed by the over-erased column repair process but still do not pass the over-erased column verification test, the disclosed method further performs an over-erased bit verification test on every bit therein and, for those bits which do not pass the over-erased bit verification test, an over-erased bit repair process is performed thereon. In comparison with conventional techniques, when checking over-erase problems, the disclosed verification and repair method doesn't need to verify all storage cells one by one. Instead, the disclosed verification and repair method first uses each column as a unit to verify and repair the over-erase problem, and only those columns which cannot be repaired by the over-erased column repair process are verified and repaired bit by bit. The disclosed method dramatically reduces the processing time to verify and repair the over-erase problems of a sector.

For example, to verify and repair the over-erase problem of the array 100 of storage cells shown in FIG. 1, the disclosed technique selects one column of storage cells, such as a first column of storage cells connected to a first bit line BL1, as the initial setting of a test column, and then performs an over-erased column verification test on the test column (the first column). Then, it is determined whether the test column (the first column) passes the over-erased column verification test. If the test column (the first column) passes the over-erased column verification test, one unverified column, such as a second column of storage cells connected to a second bit line BL2, is selected from the sector (the array 100 of storage cells) to renew the test column, and the procedure is returned to the step of performing the over-erased column verification test on the test column to thereby test the second column of storage cells. On the contrary, if the test column (the first column) does not pass the over-erased column verification test, an over-erased column repair process is performed on the test column (the first column). When the test column (the first column) does not pass the over-erased column verification test by the over-erased column repair process, an over-erased bit verification test is performed on each bit of the test column (the first column), and the bits which do not pass the over-erased bit verification test are further processed by an over-erased bit repair process individually. When no bit does not pass the over-erased bit verification test after the over-erased bit repair process, one unverified column, such as the second column of storage cells (connected by the second bit line BL2), is selected from the sector (the array 100 of storage cells) to renew the test column, and the procedure is returned to the step of performing the over-erased column verification test on the test column to test the second column. In another case wherein the test column (the first column) contains at least one bit incapable of passing the over-erased bit verification test by the over-erased bit repair process, a failure message is sent to indicate that the over-erase verification and repair method for the NOR type stack flash has failed to repair the over-erase problem of the sector.

Figure 2A:
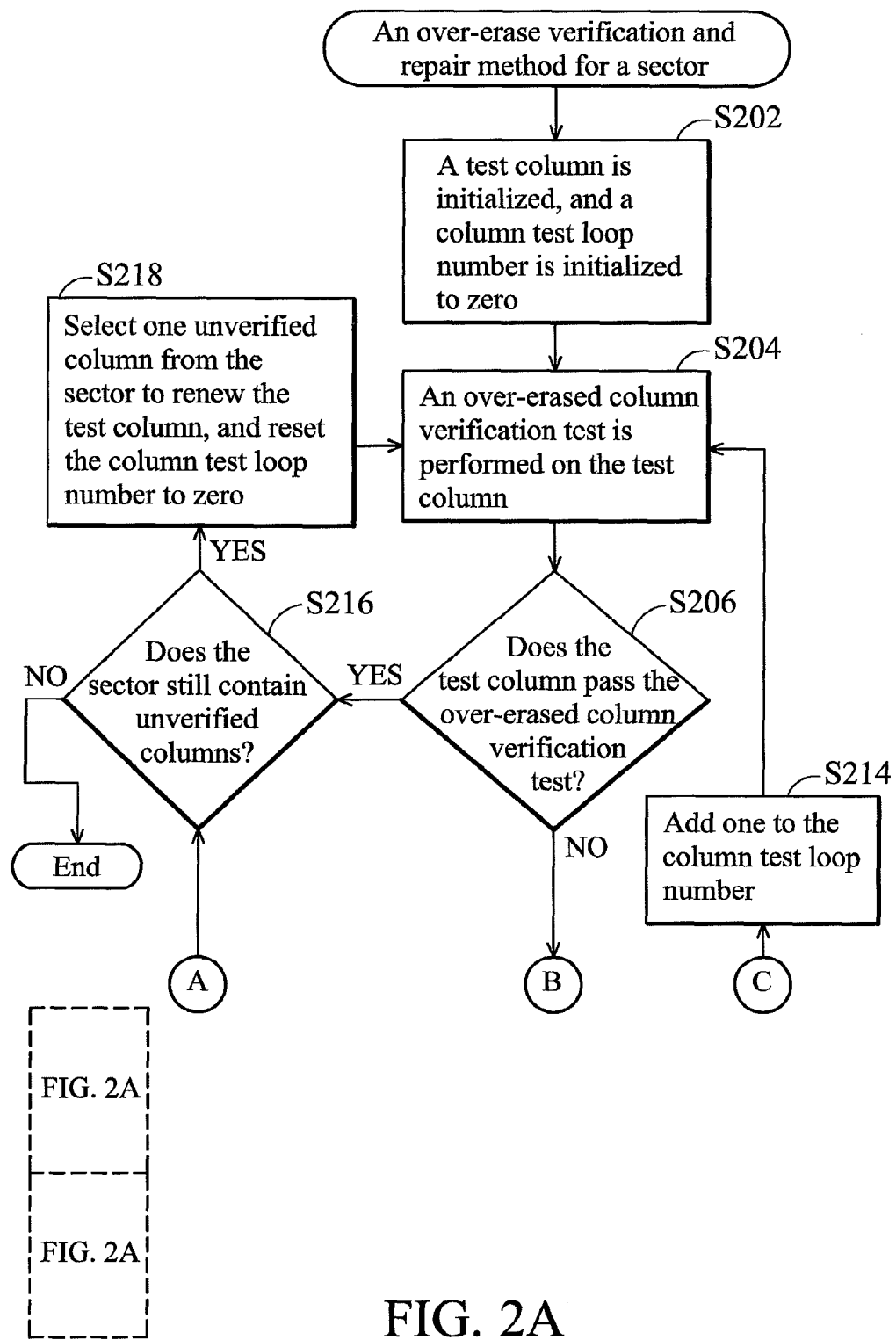
FIG. 2A and FIG. 2B are flowcharts depicting an NOR type stack flash over-erase verification and repair method in accordance with an exemplary embodiment of the invention, which verifies and repairs the over-erased storage cells of one sector.
Figure 2B:
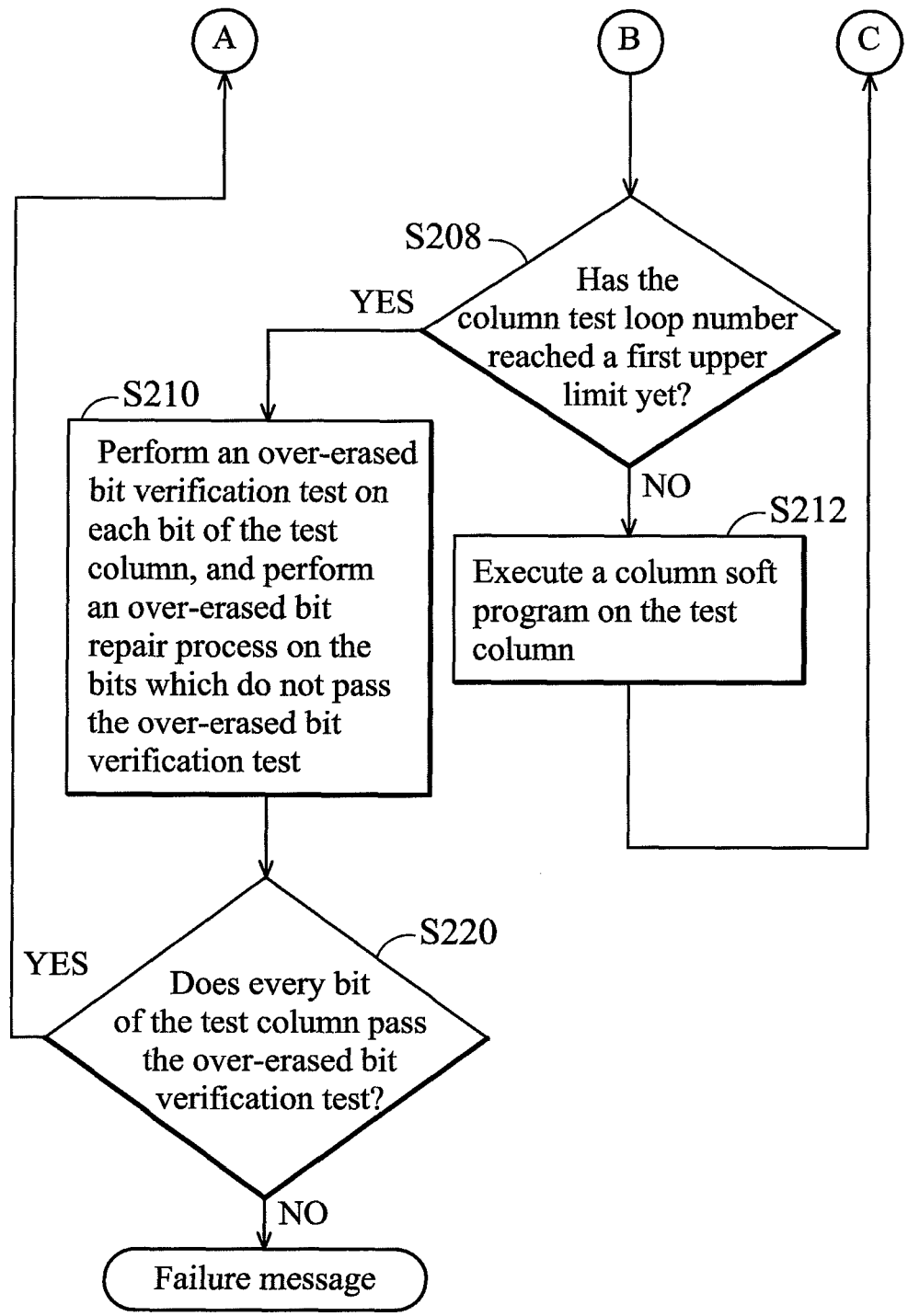

FIG. 2 is a flowchart depicting an exemplary embodiment of an over-erase verification and repair method for an NOR type stack flash, which verifies and repairs one sector.

In step S202, a test column is initialized (for example, selecting one column from the array 100 to be the test column), and a column test loop number is initialized as zero. In step S204, an over-erased column verification test is performed on the test column. In step S206, it is determined whether the test column passes the over-erased column verification test. If the determination in step S206 shows that the test column does not pass the over-erased column verification test, the flow chart precedes to an over-erased column repair process, which contains a loop containing the steps S208, S212, S214, S204 and S206.

In this paragraph, the over-erased column repair process is discussed. First, the step S208 is performed to determine whether the column test loop number has reached a first upper limit (may be determined by the user). If the determination of step S208 shows that the column test loop number has not reached the first upper limit yet, step S212 is performed to execute a column soft program on the test column. Then, the step S214 is performed to add one to the column test loop number, and the step S204 is performed again to repeat the over-erased column verification test on the test column (that was previously processed by the column soft program). In step S206, it is determined whether the current test column passes the over-erased column verification test. If the determination of the step S206 shows that the test column which was processed by the column soft program passes the over-erased column verification test, the step S216 is performed to determine whether the sector still contains unverified columns. The step S218 is performed to select one unverified column from the sector to renew the test column, and to reset the column test loop number to zero. Then, the step S204 is performed to perform the over-erased column verification test on the renewed test column and to perform the subsequent actions. On the contrary, if the test column which was processed by the column soft program still does not pass the over-erased column verification test (determined by the decision step S206), the step S208 is performed again, to determine whether the column test loop number has reached the first upper limit and, in accordance with the determination of the step S208, or to the step S212, or, to the step S210. The step S210 is performed when the determination of step S208 shows that the column test loop number has reached the first upper limit. The column test loop number, which has reached the first upper limit, means that the test column cannot pass the over-erased column verification test by the over-erased column repair process. Therefore, the step S210 is executed to perform an over-erased bit verification test on each bit of the test column and to perform an over-erased bit repair process on the bits which do not pass the over-erased bit verification test. In some embodiments, an additional step S220 is further introduced as that shown in the flowchart of FIG. 2. The step S220 is performed after the step S210. In the step S220, it is determined whether every bit of the test column passes the over-erased bit verification test. If the determination of the step S220 is 'yes', the step S216 is performed. If the determination of the step S220 is 'no', a failure message is sent, which represents that the disclosed over-erase verification and repair method for the NOR type stack flash has failed to repair all over-erased storage cells of the flash.

Referring to the array of storage cells shown in FIG. 1, this paragraph discusses an exemplary embodiment of the step S210 shown in FIG. 2, which uses each bit as a unit to perform the over-erase verification and repair. In the following discussion, the first column (containing storage cells connected by a first bit line BL1) is assumed to be the current test column. When it is determined that the test column (the first column) should be over-erase verified and repaired bit by bit, one bit (such as the storage cell controlled by a first word line WL1 and is in the first column and in the firs row of the array) is selected from the test column (the first column) as an initial setting of a test bit, and an over-erased bit verification test is performed on the test bit (the storage cell in the first column and the first row of the array), and it is determined whether the test bit (in the first column and the first row of the array) passes the over-erased bit verification test. If the test bit (in the first column and the first row of the array) passes the over-erased bit verification test, one unverified bit, such as the storage cell controlled by a second word line WL2, i.e. the storage cell in the first column and in the second row of the array, is selected from the test column (the first column) to renew the test bit, and the step of performing the over-erased bit verification test on the test bit is repeated again, to perform the over-erased bit verification test on the storage cell in the first column and the second row of the array. On the contrary, if the test bit (the storage cell in the first column and in the first row of the array) does not pass the over-erased bit verification test, an over-erased bit repair process is performed on the test bit (the storage cell in the first column and in the first row of the array). When the test bit (the storage cell in the first column and in the first row of the array) still does not pass the over-erased bit verification test after the over-erased bit repair process, a failure message is sent to show that the disclosed method failed to verify and repair all over-erased storage cells of the NOR type stack flash.

Figure 3:
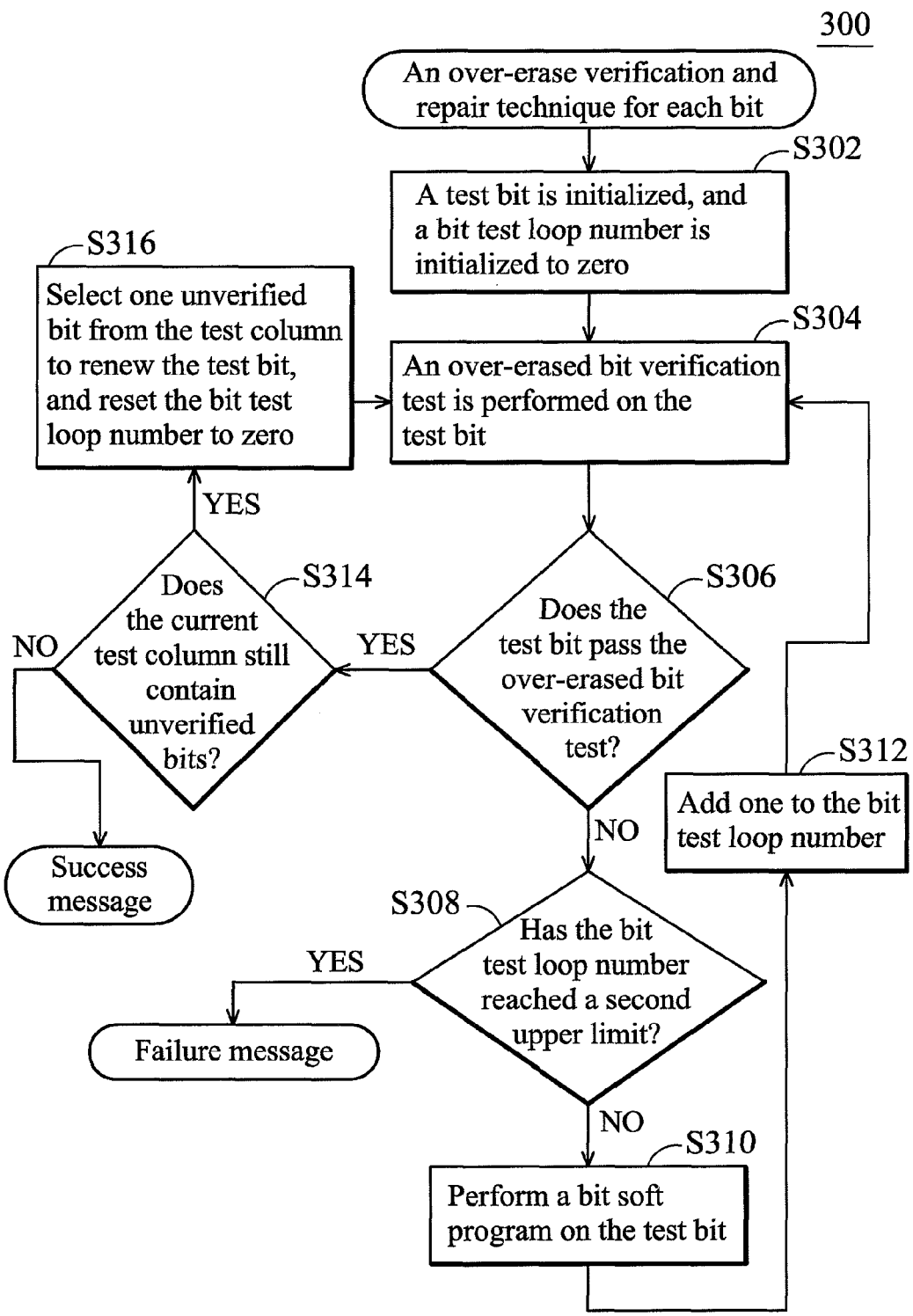
FIG. 3 is a flowchart depicting an over-erase verification and repair method in accordance with an exemplary embodiment of the invention, wherein the verification test and repair process are performed on each bit.

FIG. 3 is a flowchart depicting an exemplary embodiment of an over-erase verification and repair technique, wherein the verification and repair procedures are performed on each bit. The flowchart 300 may be applied in step S210 of FIG. 2.

In the step S302, a test bit is initialized (for example, selecting one bit from the current test column to be the test bit), and a bit test loop number is initialized to zero. In the step S304, an over-erased bit verification test is performed on the test bit. In the step S306, it is determined whether the test bit passes the over-erased bit verification test. If the determination of step S306 shows that the test bit does not pass the over-erased bit verification test, the flowchart proceeds to an over-erased bit repair process (which includes a loop including the steps S308, S310, S312, S304 and S306 of FIG. 3).

In this paragraph, the over-erased bit repair process is discussed. In the step S308, it is determined whether the bit test loop number has reached a second upper limit (wherein, the number of the second upper limit may be determined by the user). When the bit test loop number has not reached the second upper limit, the procedure proceeds to the step S310, to perform a bit soft program on the test bit. Next, in the step S312, one is added to the bit test loop number. Then, the procedure returns to the step S304, to perform the over-erased bit verification test on the test bit which was processed by the bit soft program. If the determination of the step S306 shows that the test bit, which was processed by the bit soft program, passes the over-erased bit verification test, the flowchart proceeds to the step S314, to determine whether the current test column still contains unverified bits. The step S316 is designed to select one unverified bit from the test column to renew the test bit, and to reset the bit test loop number to zero. Then, the flowchart proceeds to the step S304, to perform the over-erased bit verification test on the renewed test bit and to perform the subsequent actions. On the contrary, if the test bit that was previously processed by the bit soft program still does not pass the over-erased bit verification test (determined by the step S306), the flowchart proceeds to the step S308, to determine whether the bit test loop number has reached the second upper limit. If the bit test loop number is lower than the second upper limit, the flowchart proceeds to the step S310 to continue the over-erased bit repair process. On the contrary, if the bit test loop number has reached the second upper limit, a failure message is sent to show that the test bit cannot pass the over-erased bit verification test by the over-erased bit repair process.

Figure 4:
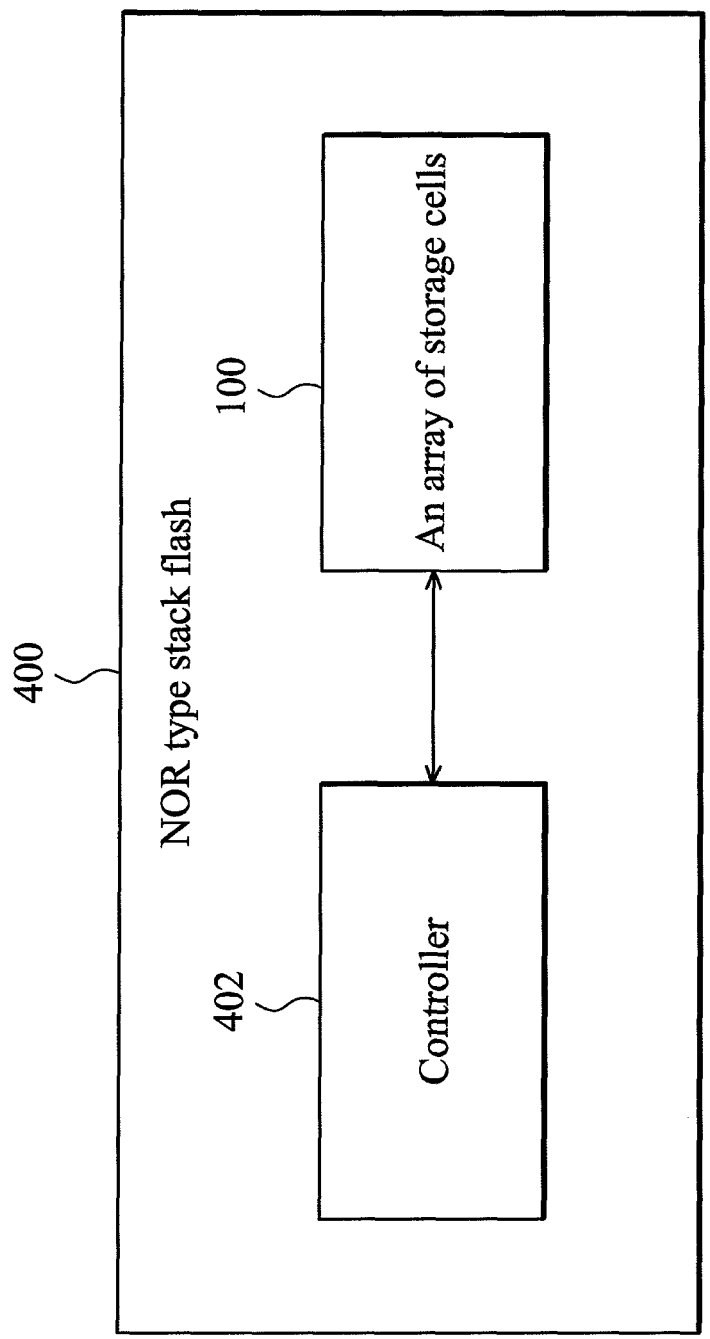
FIG. 4 is a block diagram depicting an exemplary embodiment of an NOR type stack flash.

FIG. 4 is a block diagram depicting an NOR type stack flash in accordance with an exemplary embodiment of the invention. The NOR type stack flash 400 comprises at least one sector (such as the array 100 of storage cells shown in FIG. 1) and a controller 402. The controller 402 may implement the aforementioned over-erase verification and repair methods, to perform an over-erased column verification test on the columns of the array 100, and to perform an over-erased column repair process on the columns which do not pass the over-erased column verification test, and to perform the over-erased bit verification test on the bits of the columns which still do not pass the over-erased column verification test after the over-erased column repair process, and to perform the over-erased bit repair process on the bits which do not pass the over-erased bit verification test.

The controller 402 may implement any over-erase verification and repair technique disclosed in the application.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An over-erase verification and repair method for an NOR type stack flash, comprising:
    performing an over-erased column verification test on a sector of the NOR type stack flash column by column, and performing an over-erased column repair process on the columns which do not pass the over-erased column verification test; and
    performing an over-erased bit verification test on each bit of the columns which still do not pass the over-erased column verification test after the over-erased column repair process, and performing an over-erased bit repair process on the bits which do not pass the over-erased bit verification test.

2. The method disclosed in claim 1, further comprising:
    selecting one column of storage cells from the sector as an initial setting of a test column;
    performing the over-erased column verification test on the test column;
    determining whether the test column passes the over-erased column verification test;
    selecting one unverified column from the sector when it is determined that the test column passes the over-erased column verification test, to renew the test column by the selected unverified column and then to proceed back to the step of performing the over-erased column verification test on the test column; and
    performing the over-erased column repair process on the test column when it is determined that the test column does not pass the over-erased column verification, wherein:
        when the test column processed by the over-erased column repair process still does not pass the over-erased column verification test, the over-erased bit verification test is performed on each bit of the test column and the over-erased bit repair process is performed on the bits which do not pass the over-erased bit verification test; and when no bit of the test column does not pass the over-erased bit verification test after the over-erased bit repair process, one unverified column from the sector is selected to renew the test column by the selected unverified column and the step of performing the over-erased column verification test on the test column is performed again.

3. The method as claimed in claim 2, wherein, a failure message is sent when the test column, which still does not pass the over-erased column verification test after the over-erased column repair process, has at least one bit which does not pass the over-erased bit verification test after the over-erased bit repair process, and the failure message shows that the over-erase verification and repair method failed to repair the over-erased cells of the sector.

4. The method as claimed in claim 3, further initializing a column test loop number to zero, and, when performing the over-erased column repair process, executing the following steps:
  determining whether the column test loop number has reached a first upper limit;
  determining that the test column cannot pass the over-erased column verification test by the over-erased column repair process when it is determined that the column test loop number has reached the first upper limit; and
  performing a column soft program on the test column when it is determined that the column test loop number has not reached the first upper limit, and then adding one to the column test loop number and determining again whether the test column passes the over-erased column verification test, wherein:
    selecting one unverified column from the sector if the test column passes the over-erased column verification test after the column soft program, to renew the test column by the selected unverified column, and then resetting the column test loop number to zero to perform the over-erased column verification test on the renewed test column; and
    proceeding back to the step of determining whether the column test loop number has reached the first upper limit if the test column does not pass the over-erased column verification test by the column soft program.

5. The method as claimed in claim 4, further comprising:
  selecting one bit from the test column which still does not pass the over-erased column verification test after the over-erased column repair process, to initialize a test bit;
  performing the over-erased bit verification test on the test bit;
  determining whether the test bit passes the over-erased bit verification test;
  selecting one unverified bit from the test column when it is determined that the test bit passes the over-erased bit verification test, to renew the test bit by the selected unverified bit and then to proceed back to the step of performing the over-erased bit verification test on the test bit; and
  performing the over-erased bit repair process on the test bit when it is determined that the test bit does not pass the over-erased bit verification test, wherein:
    a failure message is sent when the test bit still does not pass the over-erased bit verification test after the over-erased bit repair process, to show that the over-erase verification and repair method failed to repair the over-erased cells of the sector.

6. The method as claimed in claim 5, further resetting a bit test loop number to zero when it is determined that the test column does not pass the over-erased column verification test by the over-erased column repair process, and executing the following steps for the over-erased bit repair process:
  determining whether the bit test loop number has reached a second upper limit;
  determining that the test bit cannot pass the over-erased bit verification test by the over-erased bit repair process when it is determined that the bit test loop number has reached the second upper limit; and
  performing a bit soft program on the test bit when it is determined that the bit test loop number has not reached the second upper limit, and then adding one to the bit test loop number and determining again whether the test bit passes the over-erased bit verification test, wherein:
    one unverified bit from the test column is selected if the test bit passes the over-erased bit verification test after the bit soft program, to renew the test bit by the selected unverified bit and then to proceed back to the step of performing the over-erased bit verification test on the test bit; and
    if the test bit does not pass the over-erased bit verification test after the bit soft program, the step of determining whether the bit test loop number has reached the second upper limit is again performed.

7. An NOR type stack flash, comprising:
at least one sector comprising an array of storage cells; and
a controller, performing an over-erased column verification test on the array column by column, and performing an over-erased column repair process on the columns which do not pass the over-erased column verification test, and performing an over-erased bit verification test on each bit of the columns which still do not pass the over-erased column verification test after the over-erased column repair process, and performing an over-erased bit repair process on the bits which do not pass the over-erased bit verification test.

* * * * *